US012463187B2

(12) United States Patent
Lee et al.

(10) Patent No.: US 12,463,187 B2
(45) Date of Patent: Nov. 4, 2025

(54) MULTI WAVELENGTH LIGHT EMITTING DEVICE AND METHOD OF FABRICATING THE SAME

(71) Applicant: SEOUL VIOSYS CO., LTD., Gyeonggi-do (KR)

(72) Inventors: Chung Hoon Lee, Gyeonggi-do (KR); Dae Sung Cho, Gyeonggi-do (KR); So Ra Lee, Gyeonggi-do (KR)

(73) Assignee: Seoul Viosys Co., Ltd., Gyeonggi-do (KR)

(*) Notice: Subject to any disclaimer, the term of this patent is extended or adjusted under 35 U.S.C. 154(b) by 0 days.

(21) Appl. No.: 18/515,850

(22) Filed: Nov. 21, 2023

(65) Prior Publication Data
US 2024/0088107 A1    Mar. 14, 2024

Related U.S. Application Data

(63) Continuation of application No. 17/178,897, filed on Feb. 18, 2021, now Pat. No. 11,862,616.
(Continued)

(51) Int. Cl.
H01L 25/075     (2006.01)
H10H 20/01      (2025.01)
(Continued)

(52) U.S. Cl.
CPC ...... *H01L 25/0756* (2013.01); *H01L 25/0753* (2013.01); *H10H 20/018* (2025.01);
(Continued)

(58) Field of Classification Search
CPC ............ H10H 20/8312; H10H 20/018; H10H 20/857; H10H 20/032; H10H 20/825;
(Continued)

(56) References Cited

U.S. PATENT DOCUMENTS 5,703,436 A * 12/1997 Forrest ............... G09F 9/335
                                                    257/E33.056
10,170,666 B2    1/2019 Cha et al.
(Continued)

FOREIGN PATENT DOCUMENTS

CN    104157762 A    11/2014
JP    2009510762     3/2009
(Continued)

OTHER PUBLICATIONS

Extended European Search Report for European Application No. 21760138.4, mailed Mar. 5, 2024, 8 pages.
(Continued)

Primary Examiner — Bitew A Dinke
(74) Attorney, Agent, or Firm — LaBatt, LLC

(57) ABSTRACT

A light emitting device includes a short wavelength light emitting portion, a long wavelength light emitting portion, and a coupling layer combining the short wavelength emitting portion and the long wavelength light emitting portion. Each of the short wavelength light emitting portion and the long wavelength light emitting portion includes a first conductivity type semiconductor layer, an active layer, and a second conductivity type semiconductor layer. The active layer of the long wavelength light emitting portion contains more Indium (In) than the active layer of the short wavelength light emitting portion, and the short wavelength light emitting portion emits light of a shorter wavelength than that of light emitted from the long wavelength light emitting portion.

20 Claims, 14 Drawing Sheets

Related U.S. Application Data

(60) Provisional application No. 62/981,795, filed on Feb. 26, 2020, provisional application No. 63/074,542, filed on Sep. 4, 2020.

(51) Int. Cl.
  H10H 20/831 (2025.01)
  H10H 20/857 (2025.01)
  *H01L 23/00* (2006.01)
  *H10H 20/825* (2025.01)

(52) U.S. Cl.
  CPC ...... H10H 20/8312 (2025.01); H10H 20/857 (2025.01); *H01L 24/32* (2013.01); *H01L 2224/32145* (2013.01); *H01L 2924/12041* (2013.01); *H10H 20/032* (2025.01); *H10H 20/825* (2025.01)

(58) Field of Classification Search
  CPC .. H10H 29/10; H10H 20/8215; H10H 20/824; H10H 20/0137; H10H 20/813; H10H 20/833; H10H 20/84; H01L 25/0756; H01L 25/0753; H01L 24/32; H01L 2224/32145; H01L 2924/12041; H01L 24/05; H01L 24/06; H01L 24/19; H01L 24/20; H01L 24/24; H01L 24/13; H01L 24/16; H01L 24/48; H01L 24/73; H01L 2224/0401; H01L 2224/05555; H01L 2224/05569; H01L 2224/0557; H01L 2224/0603; H01L 2224/13101; H01L 2224/24137; H01L 2224/32245; H01L 2224/48091; H01L 2224/48247; H01L 2224/73265; H01L 2924/00014
  See application file for complete search history.

(56) References Cited

U.S. PATENT DOCUMENTS

| | | | |
|---|---|---|---|
| 11,862,616 B2* | 1/2024 | Lee | H10H 20/8312 |
| 2006/0027820 A1* | 2/2006 | Cao | H10H 20/8312 257/89 |
| 2006/0255343 A1* | 11/2006 | Ogihara | B41J 2/45 257/E25.02 |
| 2008/0211400 A1 | 9/2008 | Kim et al. | |
| 2009/0078955 A1* | 3/2009 | Fan | H10H 29/10 438/46 |
| 2013/0056785 A1 | 3/2013 | Hwang | |
| 2013/0248817 A1 | 9/2013 | Kim | |
| 2014/0252382 A1 | 9/2014 | Hashimoto et al. | |
| 2017/0288093 A1 | 10/2017 | Cha et al. | |
| 2018/0323339 A1* | 11/2018 | Robin | H10H 20/811 |
| 2019/0058143 A1* | 2/2019 | Park | H10K 59/32 |
| 2019/0097088 A1* | 3/2019 | Huppmann | H01L 24/00 |
| 2019/0164944 A1* | 5/2019 | Chae | H01L 25/13 |
| 2019/0165037 A1* | 5/2019 | Chae | H10H 20/835 |
| 2019/0165038 A1* | 5/2019 | Chae | H10H 20/8513 |
| 2019/0189596 A1* | 6/2019 | Chae | H01L 25/0753 |
| 2019/0198565 A1* | 6/2019 | Lee | H10H 20/824 |
| 2019/0206927 A1 | 7/2019 | Lee et al. | |
| 2019/0214373 A1* | 7/2019 | Kim | H01L 25/0756 |
| 2019/0267436 A1* | 8/2019 | Zhang | H10K 71/166 |
| 2020/0058825 A1* | 2/2020 | Jang | H10H 20/816 |
| 2020/0144326 A1* | 5/2020 | Lee | H10H 20/857 |
| 2020/0144448 A1* | 5/2020 | Lee | H10H 20/8312 |
| 2020/0144470 A1* | 5/2020 | Jang | H10H 20/852 |
| 2020/0259048 A1* | 8/2020 | Or-Bach | G09G 3/32 |
| 2021/0118943 A1* | 4/2021 | Or-Bach | H10H 29/10 |
| 2021/0118946 A1* | 4/2021 | Simon | H10H 29/142 |
| 2021/0384181 A1* | 12/2021 | Xu | H01L 24/32 |
| 2022/0328550 A1* | 10/2022 | Or-Bach | H10F 39/811 |
| 2023/0085036 A1* | 3/2023 | Mezouari | H10H 20/01335 257/40 |

FOREIGN PATENT DOCUMENTS

| | | |
|---|---|---|
| JP | 2013058729 | 3/2013 |
| JP | 2014175427 A | 9/2014 |
| KR | 1020070046464 A | 5/2007 |
| KR | 1020170099207 A | 8/2017 |
| KR | 1020170115142 A | 10/2017 |
| WO | 2008010793 A2 | 1/2008 |
| WO | 2019112304 | 6/2019 |
| WO | 2020036421 | 2/2020 |

OTHER PUBLICATIONS

International Search Report for corresponding International Application No. PCT/KR2021/002405, mailed Jun. 10, 2021, 2 pages.
Carpenter, Robert K., U.S. Appl. No. 17/178,897, Office Action dated Jun. 23, 2023, 11 pgs.
Carpenter, Robert K., U.S. Appl. No. 17/178,897, Notice of Allowance dated Oct. 30, 2023, 7 pgs.
Office action for Japanese Patent Application No. 2022-551694 (no English translation available), Jan. 7, 2025, 5 pages.
Office action for corresponding Japanese Patent Application No. 2022-551694, Jul. 15, 2025, 5 pages (no English translation available).

* cited by examiner

FIG. 8 (Amended)
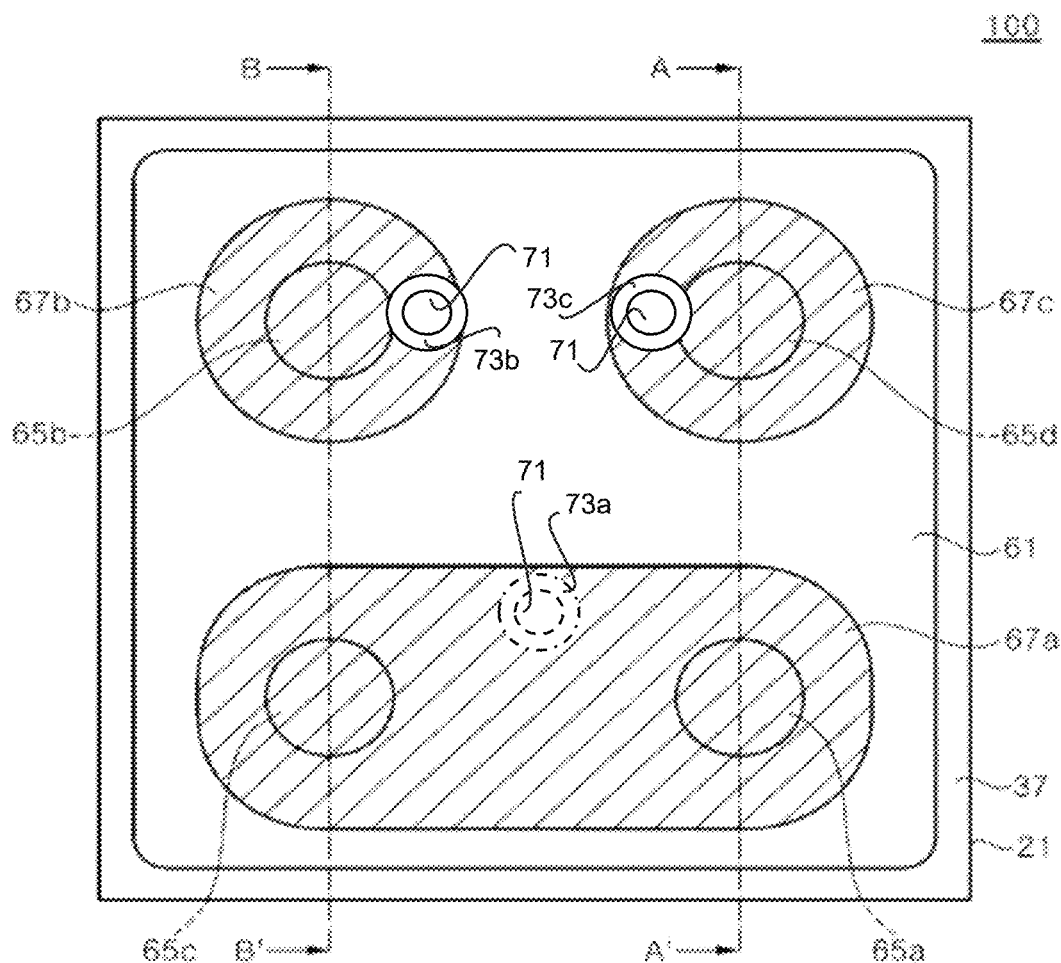

MULTI WAVELENGTH LIGHT EMITTING DEVICE AND METHOD OF FABRICATING THE SAME

CROSS-REFERENCE OF RELATED APPLICATIONS AND PRIORITY

The Present Applications is a continuation of U.S. patent application Ser. No. 17/178,897, filed on Feb. 18, 2021, which is a non-provisional Applications claiming priority to and the benefit of U.S. Provisional Application Ser. No. 62/981,795, filed Feb. 26, 2020, and U.S. Provisional Application Ser. No. 63/074,542, filed Sep. 4, 2020, the disclosures of which are incorporated herein by reference in their entireties.

TECHNICAL FIELD

The present disclosure relates to a multi wavelength light emitting device, and more particularly, to a light emitting device capable of emitting multi wavelength light without using a phosphor.

RELATED ART

As an inorganic light source, light emitting diodes have been used in various fields including displays, vehicular lamps, general lighting, and the like. With various advantages such as long lifespan, low power consumption, and rapid response, light emitting diodes have been replacing existing light sources in the art.

FIG. 1 is a schematic cross-sectional view illustrating a white light emitting device according to related art.

Referring to FIG. 1, the white light emitting device of FIG. 1 includes lead electrodes 11a and 11b, a housing 13, a light emitting diode chip 15, a bonding wire 17, and a wavelength converter 19.

The light emitting diode chip 15 may emit blue light. For example, the light emitting diode chip 15 may emit light in a wavelength range of 430 nm to 470 nm.

The wavelength converter 19 may be formed of, for example, a resin containing yellow phosphor. As yellow phosphor, YAG-based (Yttrium aluminum garnet-based) or silicate-based phosphor is mainly used. The wavelength converter 19 is disposed on a path of light emitted from the light emitting diode chip 15.

The light emitting diode chip 15 is electrically connected to the lead electrodes 11a and 11b. For example, the bonding wire 17 may electrically connect one electrode of the light emitting diode chip 15 to the lead electrode 11b, and the other electrode of the light emitting diode chip 15 may be bonded to the lead electrode 11a through a conductive material such as a conductive paste, as shown in FIG. 1.

The white light emitting device of FIG. 1 generally implements white light at a package level. More particularly, blue light emitted from a blue light emitting diode chip and yellow light emitted from a yellow phosphor may be mixed to emit white light.

Although a typical white light emitting device is exemplarily illustrated in FIG. 1, various packages may be provided, and they generally include a phosphor.

Since the white light emitting device in the related art includes the phosphor in addition to the light emitting diode chip, a manufacturing process can be more complicated and production cost increases. Furthermore, a resin in which the phosphor is spread may not be heat resistant and deteriorate over time.

SUMMARY

Exemplary embodiments provide a light emitting device capable of implementing multi wavelength light, such as white light, without using a phosphor.

Exemplary embodiments provide a light emitting device capable of implementing multi wavelength light at a wafer level or a chip level.

A light emitting device according to one or more embodiments includes a short wavelength light emitting portion, a long wavelength light emitting portion, and a coupling layer combining the short wavelength emitting portion and the long wavelength light emitting portion. Each of the short wavelength light emitting portion and the long wavelength light emitting portion includes a first conductivity type semiconductor layer, an active layer, and a second conductivity type semiconductor layer. The active layer of the long wavelength light emitting portion contains more In than the active layer of the short wavelength light emitting portion, and the short wavelength light emitting portion emits light of a shorter wavelength than that of light emitted from the long wavelength light emitting portion.

A method of fabricating a light emitting device according to one or more embodiments includes steps of forming a first LED stack on a first substrate, forming a second LED stack on a second substrate, combining the first LED stack and the second LED stack using a coupling layer, and removing the first substrate or the second substrate. Each of the first and second LED stacks includes a first conductivity type semiconductor layer, an active layer, and a second conductivity type semiconductor layer. The first LED stack is configured to emit light of a shorter wavelength than that of light emitted from the second LED stack.

DESCRIPTION OF DRAWINGS

FIG. 8 is a schematic plan view illustrating a light emitting device according to one or more embodiments.

DETAILED DESCRIPTION OF EMBODIMENTS

Figure 1:
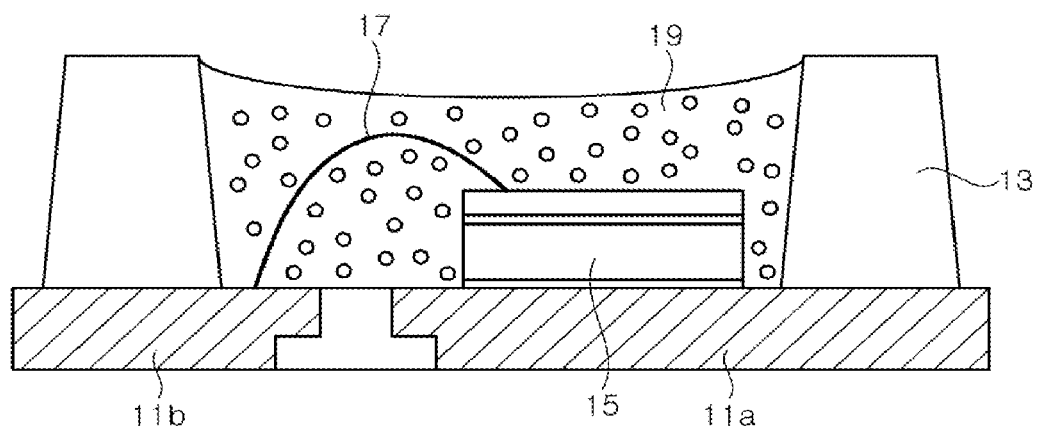
FIG. 1 is a schematic cross-sectional view illustrating a white light emitting device according to the related art.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of devices can be exaggerated for clarity and descriptive purposes. When an element or layer is referred to as being "disposed above" or "disposed on" another element or layer, it can be directly "disposed above" or "disposed on" the other element or layer or intervening devices or layers can be present. Throughout the specification, like reference numerals denote like devices having the same or similar functions.

A light emitting device according to one or more embodiments includes a short wavelength light emitting portion, a long wavelength light emitting portion, and a coupling layer combining the short wavelength emitting portion and the long wavelength light emitting portion. Each of the short wavelength light emitting portion and the long wavelength light emitting portion includes a first conductivity type semiconductor layer, an active layer, and a second conductivity type semiconductor layer. The active layer of the long wavelength light emitting portion contains more In than the active layer of the short wavelength light emitting portion, and the short wavelength light emitting portion emits light of a shorter wavelength than that of light emitted from the long wavelength light emitting portion.

Since the short wavelength light emitting portion and the long wavelength light emitting portion are combined, a light emitting device capable of emitting multi wavelength light, such as white light, may be provided without a phosphor.

The light emitting device may further include a substrate disposed on a side of the short wavelength light emitting portion or the long wavelength light emitting portion.

In at least one variant, the short wavelength light emitting portion may emit blue light, and the long wavelength light emitting portion may emit yellow light. In another variant, the short wavelength light emitting portion may also emit ultraviolet light.

Light emitted from the long wavelength light emitting portion may be emitted through the short wavelength light emitting portion. As such, light loss may be reduced.

The coupling layer may be an insulation layer or a transparent electrode.

The light emitting device may further include a first bonding pad commonly electrically connected to the short wavelength light emitting portion and the long wavelength light emitting portion and a second bonding pad and a third bonding pad electrically connected to the short wavelength light emitting portion and the long wavelength light emitting portion, respectively.

The light emitting device may be flip-bonded using the first, second, and third bonding pads.

In at least one variant, the first bonding pad is commonly electrically connected to the first conductivity type semiconductor layers of the short wavelength light emitting portion and the long wavelength light emitting portion. The second bonding pad is electrically connected to the second conductivity type semiconductor layer of the short wavelength light emitting portion. The third bonding pad is electrically connected to the second conductivity type semiconductor layer of the long wavelength light emitting portion.

Moreover, the light emitting device may further include buried vias electrically connecting the first, second, and third bonding pads to the first and second conductivity type semiconductor layers.

The light emitting device may further include a planarization layer, in which the buried vias may pass through the planarization layer, and the first, second, and third bonding pads may be disposed on the planarization layer.

In another variant, the first bonding pad is commonly electrically connected to the second conductivity type semiconductor layers of the short wavelength light emitting portion and the long wavelength light emitting portion. The second bonding pad is electrically connected to the second conductivity type semiconductor layer of the short wavelength light emitting portion, and the third bonding pad is electrically connected to the second conductivity type semiconductor layer of the long wavelength light emitting portion.

In further another variant, the short wavelength light emitting portion and the long wavelength light emitting portion may be independently driven. In another variant, the short wavelength light emitting portion and the long wavelength light emitting portion may be driven together.

The light emitting device may further include a substrate, and a plurality of light emitting cells disposed on the substrate. Each of the light emitting cells may include the short wavelength light emitting portion, the long wavelength light emitting portion, and the coupling layer.

Moreover, the light emitting device may further include connectors for electrically connecting the plurality of light emitting cells.

In another variant, the plurality of light emitting cells may be connected in series-parallel to one another.

A method of fabricating a light emitting device according to one or more embodiments includes steps of forming a first LED stack on a first substrate; forming a second LED stack on a second substrate, combining the first LED stack and the second LED stack using a coupling layer, and removing the first substrate or the second substrate. Each of the first and second LED stacks includes a first conductivity type semiconductor layer, an active layer, and a second conductivity type semiconductor layer, and the first LED stack is configured to emit light of a shorter wavelength than that of light emitted from the second LED stack.

In at least one variant, the first LED stack may be configured to emit blue light, and the second LED stack may be configured to emit yellow light.

The method of fabricating a light emitting device may further include forming a first transparent electrode and a second transparent electrode on the first LED stack and the second LED stack, respectively, before combining the first LED stack and the second LED stack.

The method of fabricating a light emitting device may further include forming a lower p-electrode pad on the first transparent electrode.

In addition, the method of fabricating a light emitting device may further include; before combining the first LED stack and the second LED stack, exposing the first conductivity type semiconductor layer of the first LED stack by patterning the first transparent electrode and the first LED stack; and forming a lower n-electrode on the exposed first conductivity type semiconductor layer.

The method of fabricating a light emitting device may further include forming an upper p-electrode pad on the second transparent electrode.

Hereinafter, exemplary embodiments will be described in detail with reference to the accompanying drawings.

Figure 2:
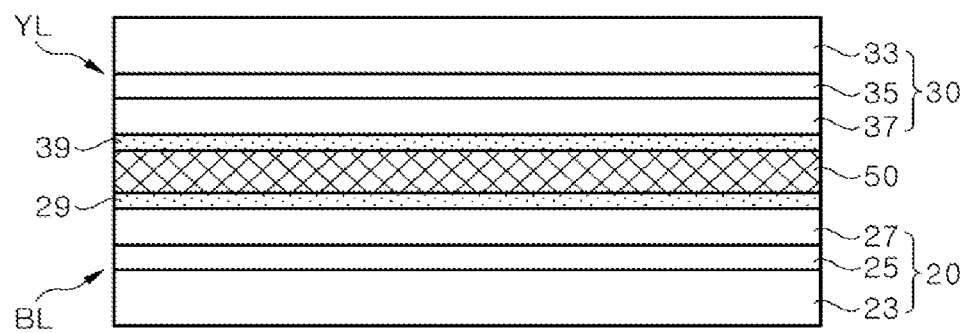
FIG. 2 is a schematic cross-sectional view illustrating a light emitting device according to one or more embodiments.

FIG. 2 is a schematic cross-sectional view illustrating a light emitting device according to one or more embodiments.

Referring to FIG. 2, the light emitting device according to one or more embodiments includes a short wavelength light emitting portion BL, a long wavelength light emitting portion YL, and an insulation layer 50. The short wavelength light emitting portion BL may include a first LED stack 20, and may further include a first transparent electrode 29. The long wavelength light emitting portion YL may include a second LED stack 30, and may further include a second transparent electrode 39.

The first LED stack 20 may include a first conductivity type semiconductor layer 23, an active layer 25, and a second conductivity type semiconductor layer 27. In some forms, each of the first conductivity type semiconductor layer 23, the active layer 25, and the second conductivity type semiconductor layer 27 may be a gallium nitride-based semiconductor layer. Additionally, or alternatively, each of the first and second conductivity type semiconductor layers 23 and 27 may be a single layer or a multiple layer. The active layer 25 may have a multiple quantum well structure, and a material and a thickness thereof may be selected to emit light in a wavelength range of, for example, 365 nm to 460 nm.

The second LED stack 30 may include a first conductivity type semiconductor layer 33, an active layer 35, and a second conductivity type semiconductor layer 37. In some forms, each of the first conductivity type semiconductor layer 33, the active layer 35, and the second conductivity type semiconductor layer 37 may be a gallium nitride-based semiconductor layer. Additionally, or alternatively, each of the first and second conductivity type semiconductor layers 33 and 37 may be a single layer or multiple layers. The active layer 35 may have a multiple quantum well structure, and a material and a thickness thereof may be selected to emit light in a wavelength range of, for example, 500 nm to 600 nm. A well layer of the active layer 35 may contain more Indium (In) than a well layer of the active layer 25. The first conductivity type semiconductor layers 23 and 33 of the LED stacks 20 and 30 are n-type semiconductor layers, respectively, and the second conductivity type semiconductor layers 27 and 37 thereof are p-type semiconductor layers.

The first transparent electrode 29 is in contact with the second conductivity type semiconductor layer 27 of the first LED stack 20. The first transparent electrode 29 may be formed using a transparent conductive oxide (TCO) or a metal layer. The transparent conductive oxide layer may include $SnO_2$, $InO_2$, ITO, ZnO, IZO, or the like. The first transparent electrode 29 transmits light generated in the first LED stack 20 or the second LED stack 30.

The second transparent electrode 39 is in contact with the second conductivity type semiconductor layer 37 of the second LED stack 30. The second transparent electrode 39 may be formed using a transparent conductive oxide (TCO) or a metal layer. The transparent conductive oxide layer may include $SnO_2$, $InO_2$, ITO, ZnO, IZO, or the like. The second transparent electrode 39 transmits light generated in the first LED stack 20 or the second LED stack 30.

The insulation layer 50 is disposed between the short wavelength light emitting portion BL and the long wavelength light emitting portion YL. The insulation layer 50 may combine the short wavelength light emitting portion BL and the long wavelength light emitting portion YL. For example, the insulation layer 50 may combine the short wavelength light emitting portion BL and the long wavelength light emitting portion YL between the first transparent electrode 29 and the second transparent electrode 39.

The insulation layer 50 may be formed of a transparent organic material layer or a transparent inorganic material layer. The organic material layer may be $SU_8$, poly(methylmethacrylate); PMMA, polyimide, parylene, benzocyclobutene (BCB), or the like, and the inorganic material layer may include $Al_2O_3$, $SiO_2$, $SiN_x$, or the like. In addition, the insulation layer 50 may be formed of spin-on-glass (SOG).

Figure 3:
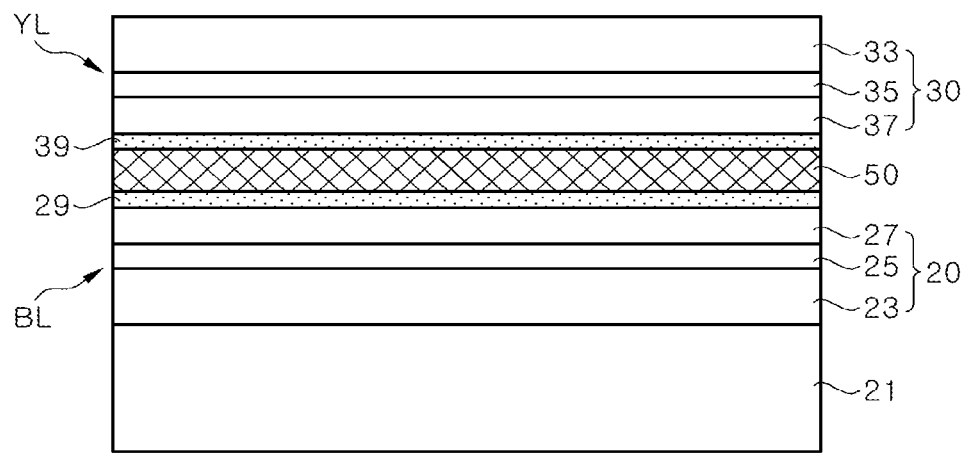
FIG. 3 is a schematic cross-sectional view illustrating the light emitting device of FIG. 2 having a first substrate.

In one or more embodiments, the light emitting device, as illustrated in FIG. 3, may further include a first substrate 21. The first substrate 21 may be disposed on a side of the short wavelength light emitting portion BL. The first substrate 21 may be a substrate that can be used to grow the first LED stack 20, such as a sapphire substrate, a SiC substrate, or a GaN substrate. In one or more embodiments, the first substrate 21 may be a flat sapphire substrate, but may be a patterned sapphire substrate. Light generated from the short wavelength light emitting portion BL and the long wavelength light emitting portion YL may be emitted to the outside through the first substrate 21, and thus, the first substrate 21 may be a transparent substrate that transmits light generated from the short wavelength light emitting portion BL and the long wavelength light emitting portion YL. However, the inventive concepts are not limited thereto, and light generated from the short wavelength emission portion BL and the long wavelength emission portion YL may be emitted to an opposite side of the first substrate 21. In this case, the first substrate 21 may be an opaque substrate.

Figure 4:
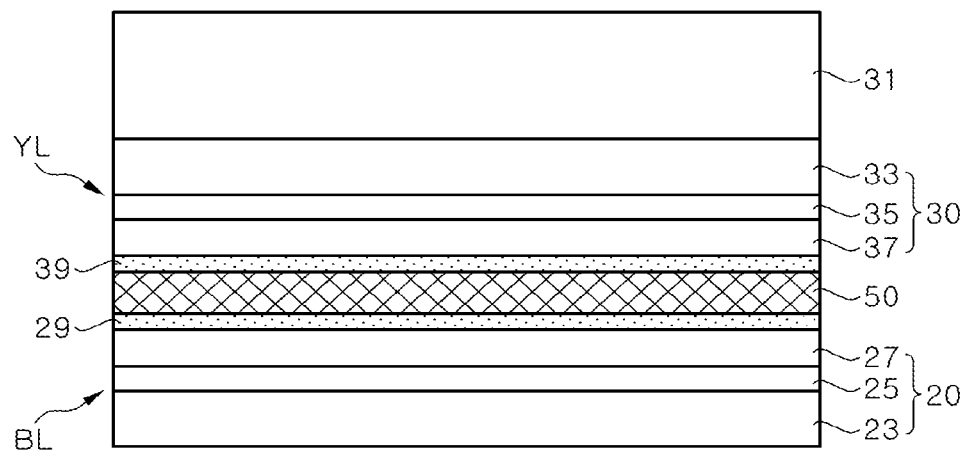
FIG. 4 is a schematic cross-sectional view illustrating the light emitting device of FIG. 2 having a second substrate.

In another exemplary embodiment, the light emitting device, as illustrated in FIG. 4, may further include a second substrate 31. The second substrate 31 may be disposed on a side of the long wavelength light emitting portion YL. The second substrate 31 may be a substrate that can be used to grow the second LED stack 30, such as a sapphire substrate, a SiC substrate, or a GaN substrate. In one or more embodiments, the second substrate 31 may be a flat sapphire substrate, but may be a patterned sapphire substrate. Light generated from the short wavelength light emitting portion BL and the long wavelength light emitting portion YL may be emitted to the outside through the second substrate 31, and thus, the second substrate 31 may be a transparent substrate that transmits light generated from the short wavelength light emitting portion BL and the long wavelength light emitting portion YL. However, the inventive concepts are not limited thereto, and light generated from the short wavelength light emitting portion BL and the long wavelength light emitting portion YL may be emitted to an opposite side of the second substrate 31. In this case, the second substrate 31 may be an opaque substrate.

The light emitting device may be formed by, for example, bonding the first transparent electrode 29 and the second transparent electrode 39 using the insulation layer 50 so that the first transparent electrode 29 and the second transparent electrode 39 face each other, after growing the first conductivity type semiconductor layers 23 and 33, the active layers 25 and 35, and the second conductivity type semiconductor layers 27 and 37 on the first substrate 21 and the second substrate 31, respectively, and forming the first transparent electrode 29 and the second transparent electrode 39 on the second conductivity type semiconductor layers 27 and 37, respectively. Thereafter, the second substrate 31 may be separated to fabricate the light emitting device as illustrated in FIG. 3, or the first substrate 21 may be separated to fabricate the light emitting device as illustrated in FIG. 4. Both the first substrate 21 and the second substrate 31 are removed, and another substrate may be attached.

Before the bonding process, the first LED stack 20 or the second LED stack 30 may be patterned, and additional electrode pads may be formed on the first transparent electrode 29 or the second transparent electrode 39.

Figure 5:
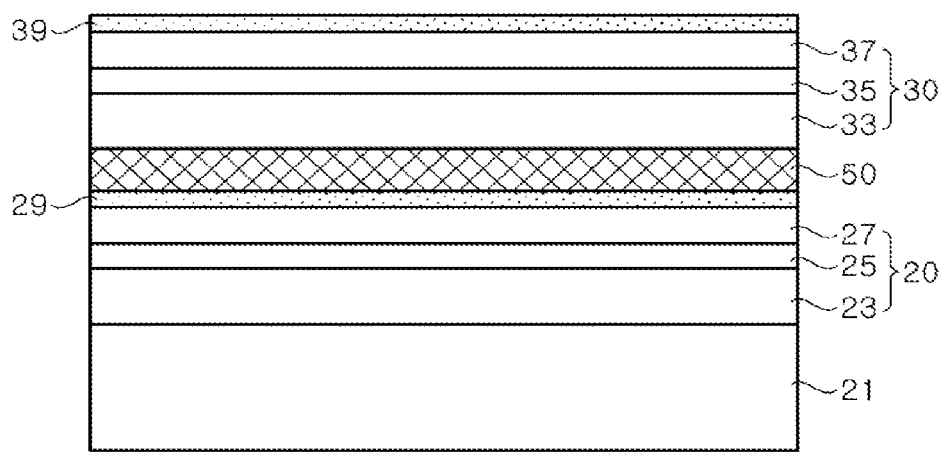
FIG. 5 is a schematic cross-sectional view illustrating the light emitting device of FIG. 5 having an insulation layer that combines a first transparent electrode and a first conductive type semiconductor layer.

FIG. 5 is a schematic cross-sectional view illustrating a light emitting device according to one or more embodiments.

Referring to FIG. 5, the light emitting device according to the exemplary embodiment is substantially similar to the light emitting device of FIG. 4, but an insulation layer 50 combines a first transparent electrode 29 and a first conductivity type semiconductor layer 33 in the exemplary embodiment. An active layer 35 is located on the first conductivity type semiconductor layer 33, and a second conductivity type semiconductor layer 37 is located on the active layer 35. A second transparent electrode 39 may be located on the second conductivity type semiconductor layer 37.

In the illustrated embodiment, light generated in the second LED stack 30 may be emitted through a first substrate 21, and in this case, light does not need to proceed through the second transparent electrode 39. Accordingly, a reflective metal layer (not shown) may be disposed on the second conductivity type semiconductor layer 37, instead of the second transparent electrode 39 or in addition to the second transparent electrode 39.

The light emitting device according to the illustrated exemplary embodiment may be fabricated by, for example, combining the second LED stack 30 and the first LED stack 20 after transferring the second LED stack 30 and the second transparent electrode 39 grown on a second substrate 31 onto a temporary substrate, and separating the second substrate 31 first. The temporary substrate may be separated after the second LED stack 30 and the first LED stack 20 are combined, and thus, a light emitting device in which the second transparent electrode 39 is disposed far from the insulation layer 50 may be provided.

Figure 6:
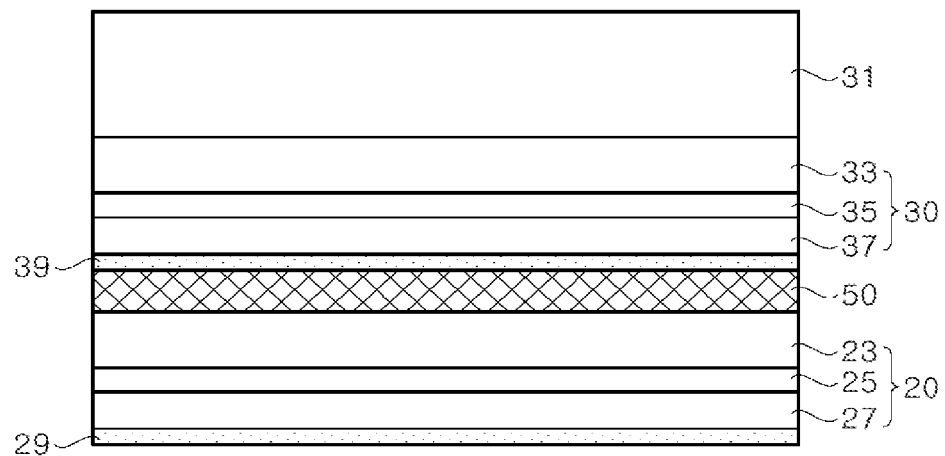
FIG. 6 is a schematic cross-sectional view illustrating the light emitting device of FIG. 2 having a second substrate while a first substrate is removed.

The light emitting device, in which the first substrate 21 remains and the second substrate 31 is removed, is exemplarily described, but through the similar process, the second substrate 31 may remain, and the first substrate 21 may be removed, as illustrated in FIG. 6. In the exemplary embodiment of FIG. 6, the second transparent electrode 39 will be transparent to light generated in the first LED stack 20 or the second LED stack 30. In addition, when light generated in the first LED stack 20 and the second LED stack 30 is emitted to the outside through the second substrate 31 in the exemplary embodiment of FIG. 6, a reflective metal layer may be disposed on a second conductivity type semiconductor layer 27, instead of the first transparent electrode 29, or in addition to the first transparent electrode 29.

Figure 7:
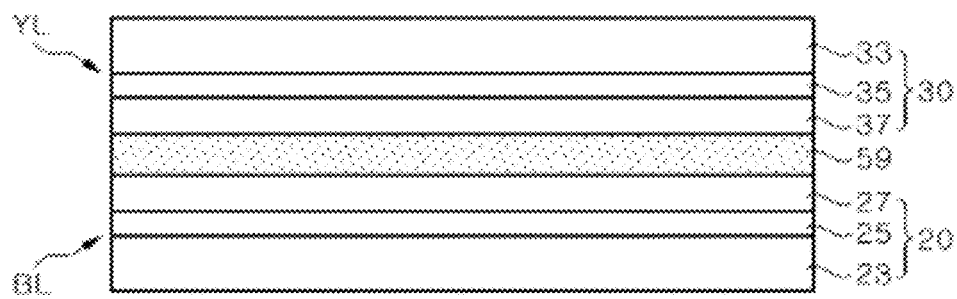
FIG. 7 is a schematic cross-sectional view illustrating the light emitting device having a transparent electrode.

FIG. 7 is a schematic cross-sectional view illustrating a light emitting device according to one or more embodiments.

Referring to FIG. 7, the light emitting device according to the exemplary embodiment is substantially similar to the light emitting device described with reference to FIG. 2, but a short wavelength light emitting portion BL and a long wavelength light emitting portion YL are combined by a transparent electrode 59 instead of an insulation layer 50 in the exemplary embodiment. For example, the transparent electrode 59 of FIG. 7 may be formed by directly bonding the first transparent electrode 29 and the second transparent electrode 39 of FIG. 3.

The transparent electrode 59 is commonly electrically connected to second conductivity type semiconductor layers 27 and 37, and thus, the second conductive type semiconductor layer 27 of the first LED stack 20 and the second conductive type semiconductor layer 37 of the second LED stack 30 are electrically connected to each other.

Meanwhile, in the illustrated exemplary embodiment, a first substrate 21 may be disposed on a side of a first conductivity type semiconductor layer 23, and a second substrate 31 may be disposed on a side of a first conductivity type semiconductor layer 33.

In the above, a stacked structure of various light emitting devices in which the short wavelength light emitting portion BL and the long wavelength light emitting portion YL are combined by the insulation layer 50 or the transparent electrode layer 59 has been described. However, the inventive concepts are not limited to these light emitting devices, and various other light emitting devices may also be possible. Meanwhile, at least two electrodes may be disposed to supply external power to the short wavelength light emitting portion BL and the long wavelength light emitting portion YL. Hereinafter, light emitting devices having various structures in which three or four electrodes are formed will be described in detail.

Figure 9A:
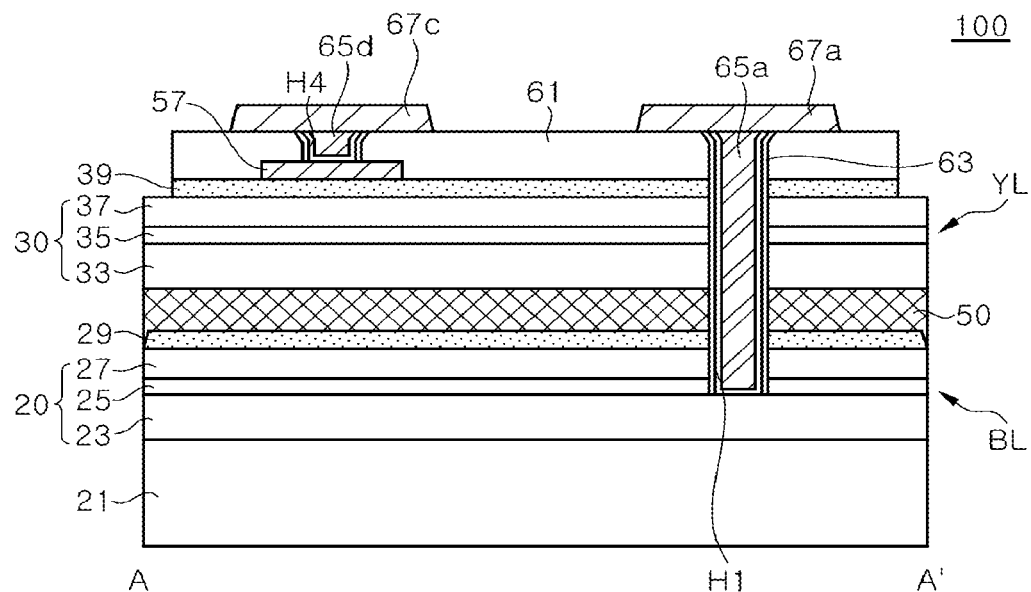
FIG. 9A is a schematic cross-sectional view taken along line A-A' of FIG. 8.
Figure 9B:
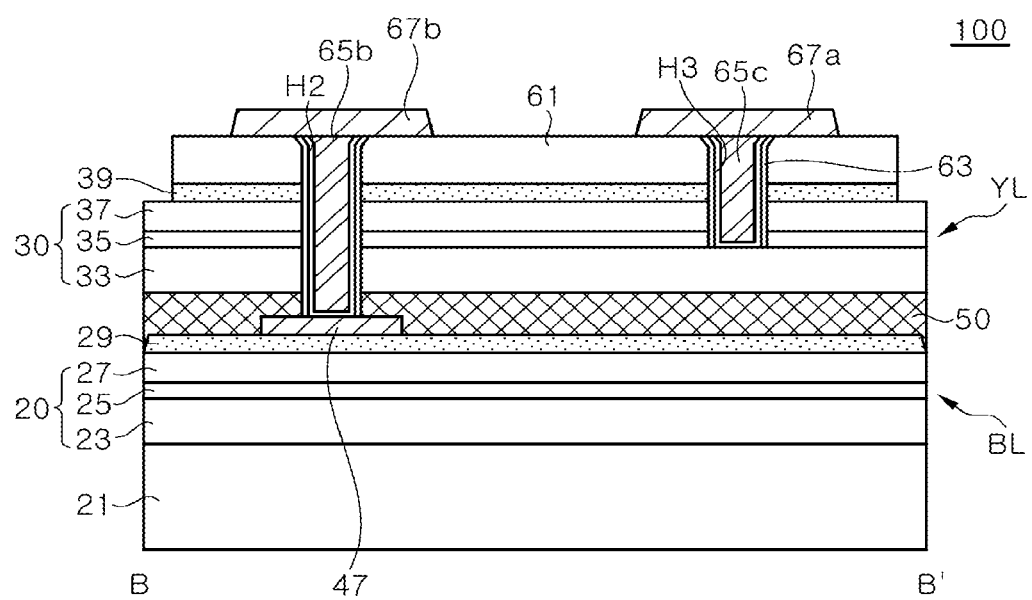
FIG. 9B is a schematic cross-sectional view taken along line B-B' of FIG. 8.

FIG. 8 is a schematic plan view illustrating a light emitting device 100 according to one or more embodiments, FIG. 9A is a schematic cross-sectional view taken along line A-A' of FIG. 8, and FIG. 9B is a schematic cross-sectional view taken along line B-B' of FIG. 8.

For convenience of description, bonding pads 67a, 67b, and 67c are illustrated and described as being disposed at an upper side, but the inventive concepts are not limited thereto. For example, in some exemplary embodiments, the light emitting device may be flip-bonded on a circuit board, and in this case, the bonding pads 67a, 67b, and 67c may be disposed at a lower side.

Referring to FIGS. 8, 9A, and 9B, the light emitting device 100 includes a first LED stack 20, a second LED stack 30, a first transparent electrode 29, and a second transparent electrode 39, a lower p-electrode pad 47, an upper p-electrode pad 57, an insulation layer 50, a planarization layer 61, a sidewall insulation layer 63, buried vias 65a, 65b, 65c, and 65d, and first, second, and third bonding pads 67a, 67b, and 67c.

Further, the light emitting device 100 may include through holes H1 (FIG. 9A) and H2 (FIG. 9B) passing through the second LED stack 30, a through hole H3 (FIG. 9B) partially passing through the second LED stack 30, and a through hole H4 (FIG. 9A) located on the LED stack 30.

The light emitting device 100 has a basic layer structure of a short wavelength light emitting portion BL and a long wavelength light emitting portion YL is similar to that described with reference to FIG. 5, but the lower p-electrode pad 47 and the upper p-electrode pad 57 may be added on a first transparent electrode 29 and a second transparent electrode 39, respectively.

As illustrated in FIGS. 9A and 9B, in the exemplary embodiments, the first and second LED stacks 20 and 30 are stacked in the vertical direction. The first LED stack 20 is disposed on a substrate 21, and the second LED stack 30 is combined to the first LED stack 20. Before the second LED stack 30 is combined to the first LED stack 20, the lower p-electrode pad 47 may be formed on the first transparent electrode 29. The lower p-electrode pad 47 may be formed using, for example, a lift-off technique. The lower p-electrode pad 47 may be formed of a metal layer. The lower p-electrode pad 47 may be formed of, for example, Cr/Au/Ti, but the inventive concepts are not particularly limited thereto. The lower p-electrode pad 47 may be omitted.

Meanwhile, the second LED stack 30 is grown on a second substrate, and thereafter, may be bonded to the first LED stack 20 using the insulation layer 50 using a TBDB (temporary bonding debonding) technology. The second transparent electrode 39 may be formed before bonding, or may be formed after bonding.

The upper p-electrode pad 57 may be partially formed on the second transparent electrode 39. The upper p-electrode pad 57 may be formed of a metal layer, and a material thereof is not particularly limited. The upper p-electrode pad 57 may be formed of an identical material as that of the lower p-electrode pad 47. The upper p-electrode pad 57 may be disposed not to be overlapped with the lower p-electrode pad 47.

The planarization layer 61 may cover the second transparent electrode 39 and the upper p-electrode pad 57. The planarization layer 61 may have a flat upper surface. The planarization layer 61 is disposed over a second conductivity type semiconductor layer 37. A side surface of the planarization layer 61 may be flush with the second conductivity type semiconductor layer 37, but the inventive concepts are not limited thereto, and as illustrated in FIGS. 9A and 9B, may be recessed inwardly from an edge of the second LED stack 30. Further, the side surface of the planarization layer 61 may be flush with a side surface of the second transparent electrode 39. The planarization layer 61 may be patterned by photolithography and etching processes, and in this case, the second transparent electrode 39 may be patterned together. As such, the second conductivity type semiconductor layer 37 may be exposed around the planarization layer 61. The planarization layer 61 may be formed of an aluminum oxide film, a silicon oxide film, or a silicon nitride film.

Through holes H1, H2, H3, and H4 may be formed to provide an electrical path to the short wavelength light emitting portion BL and the long wavelength light emitting portion YL. The through holes H1, H2, H3, and H4 are spaced apart from one another. Since the through holes H1, H2, H3, and H4 have different depths from one another, they may be formed using different processes from one another.

The through hole H1 may pass through the planarization layer 61, the second transparent electrode 39, the second LED stack 30, the insulation layer 50, a first transparent electrode 29, a second conductivity type semiconductor layer 27, and an active layer 25, and may expose a first conductivity type semiconductor layer 23. The through hole H2 may pass through the planarization layer 61, the second transparent electrode 39, the second LED stack 30, and the insulation layer 50 to expose the lower p-electrode pad 47. The through hole H3 may pass through the planarization layer 61, the second transparent electrode 39, the second conductivity type semiconductor layer 37, and the active layer 35 to expose the first conductivity type semiconductor layer 23. The through hole H4 may pass through the planarization layer 61 to expose the upper p-electrode pad 57.

The sidewall insulation layer 63 covers sidewalls of the through holes H1, H2, H3, and H4, and has openings exposing bottoms of the through holes H1, H2, H3, and H4. The sidewall insulation layer 63 may be formed using, for example, a chemical vapor deposition technique or an atomic layer deposition technique, and may be formed of, for example, aluminum oxide, silicon oxide, or silicon nitride. After the through holes H1, H2, H3, and H4 are formed, the sidewall insulation layer 63 may be formed to cover the planarization layer 61 and the inside of the through holes H1, H2, H3, and H4, and thereafter, openings exposing bottom surfaces may be formed by removing the sidewall insulation layer formed at the bottoms of the through holes H1, H2, H3, and H4 through blanket etching.

Buried vias 65a, 65b, 65c, and 65d may fill the through holes H1, H2, H3, and H4, respectively. The buried vias 65a, 65b, and 65c are insulated from inner walls of the through holes H1, H2, and H3 by the sidewall insulation layer 63 to prevent an electrical short.

The buried via 65a is electrically connected to the first conductivity type semiconductor layer 23 of the first LED stack 20. The buried via 65b may be electrically connected to the lower p-electrode pad 47, and may be electrically connected to the second conductivity type semiconductor layer 27 through the lower p-electrode pad 47 and the first transparent electrode 29, as shown in FIG. 9B. The buried via 65c may be electrically connected to a first conductivity type semiconductor layer 33 of the second LED stack 30, and the buried via 65d may be electrically connected to the upper p-electrode pad 57.

The buried vias 65a, 65b, 65c, and 65d may be formed using a chemical mechanical polishing technique. For example, after forming a seed layer and filling the through holes H1, H2, H3, and H4 with a conductive material such as Cu using a plating technique, the buried vias 65a, 65b, 65c, and 65d may be formed by removing metal layers on the planarization layer 61 using the chemical mechanical polishing technique. As illustrated in FIGS. 9A and 9B, the buried vias 65a, 65b, and 65c may have a relatively wider width at inlets of the through holes H1, H2, and H3 than the bottom surfaces thereof, and thus, electrical connections may be strengthened. Meanwhile, the buried via 65d may have a column shape in which upper and bottom surfaces thereof have substantially the same size.

The buried vias 65a, 65b, 65c, and 65d may be formed together through an identical process. As such, the upper surfaces of the buried vias 65a, 65b, 65c, and 65d may be substantially flush with the planarization layer 61.

The bonding pads 67a, 67b, and 67c may be disposed on respective regions of the planarization layer 61. The first bonding pad 67a may be electrically connected to the buried via 65a, and may also extend in the lateral direction to be electrically connected to the buried via 65c. As such, the first conductivity type semiconductor layer 23 of the first LED stack 20 and the first conductivity type semiconductor layer 33 of the second LED stack 30 may be commonly electrically connected. The first bonding pad 67a may cover the buried vias 65a and 65c (see FIG. 8).

The second bonding pad 67b is electrically connected to the buried via 65b. The second bonding pad 67b may cover the buried via 65b. The third bonding pad 67c is electrically connected to the buried via 65d. The third bonding pad 67c may cover the buried via 65d.

In the illustrated exemplary embodiment, all of the first, second, and third bonding pads 67a, 67b, and 67c are disposed on the planarization layer 61. The first, second, and third bonding pads 67a, 67b, and 67c may be formed together through an identical process, and thus, elevations of upper surfaces thereof may be identical.

In the illustrated exemplary embodiment, when the light emitting device 100 is bonded to a circuit board, the first, second, and third bonding pads 67a, 67b, and 67c may be bonded to pads 73a, 73b, 73c on the circuit board 71 by a bonding material such as solder paste. Alternatively, bumps may be additionally formed on the first, second, and third bonding pads 67a, 67b, and 67c, and the light emitting device 100 may be bonded to the circuit board 71 using the bumps.

The light emitting device 100 according to the exemplary embodiment may emit light of a short wavelength of ultraviolet or blue light using the first LED stack 20, and may emit light of a long wavelength of green light or yellow light using the second LED stack 30. The light emitting device 100 may implement mixed color light by a combination of long wavelength light and short wavelength light, and may implement white light, for example, by a combination of blue light and yellow light.

Further, since the first conductivity type semiconductor layer 23 of the first LED stack 20 and the first conductivity type semiconductor layer 33 of the second LED stack 30 are commonly electrically connected, the first conductivity type semiconductor layers 23 and 33 may be electrically connected to a single boding pad 67a. As such, the first LED stack 20 and the second LED stack 30 may be independently driven using three bonding pads. Moreover, the buried vias 65a and 65b electrically connected to the first conductivity type semiconductor layer 23 and the second conductivity type semiconductor layer 27 of the first LED stack 20 are disposed in the diagonal direction in the light emitting device 100. In addition, the buried vias 65c and 65d electrically connected to the first conductivity type semiconductor layer 33 and the second conductivity type semiconductor layer 37 of the second LED stack 30 are disposed in the diagonal direction in the light emitting device 100. Since the buried vias 65a and 65b connected to the first LED stack 20 and the buried vias 65c and 65d electrically connected to the second LED stack 30 are disposed in the diagonal direction, current spread in the first LED stack 20 and the second LED stack 30 may be assisted, and thus, luminous efficiency of the light emitting device 100 may be increased.

In the illustrated exemplary embodiment, although the first conductivity type semiconductor layer 23 of the first LED stack 20 and the first conductivity type semiconductor layer 33 of the second LED stack 30 are commonly electrically connected, the inventive concepts are not limited thereto. For example, the second conductivity type semiconductor layer 27 of the first LED stack 20 and the second conductivity type semiconductor layer 37 of the second LED stack 30 may be commonly electrically connected. For example, the first bonding pad 67a is divided and disposed on the buried vias 65a and 65c, respectively, and the second bonding pad 67b and the third bonding pad 67c are connected to each other, and thus, the second conductivity type semiconductor layer 27 of the stack 20 and the second conductivity type semiconductor layer 37 of the second LED stack 30 may be commonly electrically connected.

In another exemplary embodiment, the second conductivity type semiconductor layer 27 of the first LED stack 20 and the second conductivity type semiconductor layer 37 of the second LED stack 30 may also be electrically connected to a single bonding pad. In this case, the first LED stack 20 and the second LED stack 30 may be simultaneously driven using two bonding pads.

Figure 10:
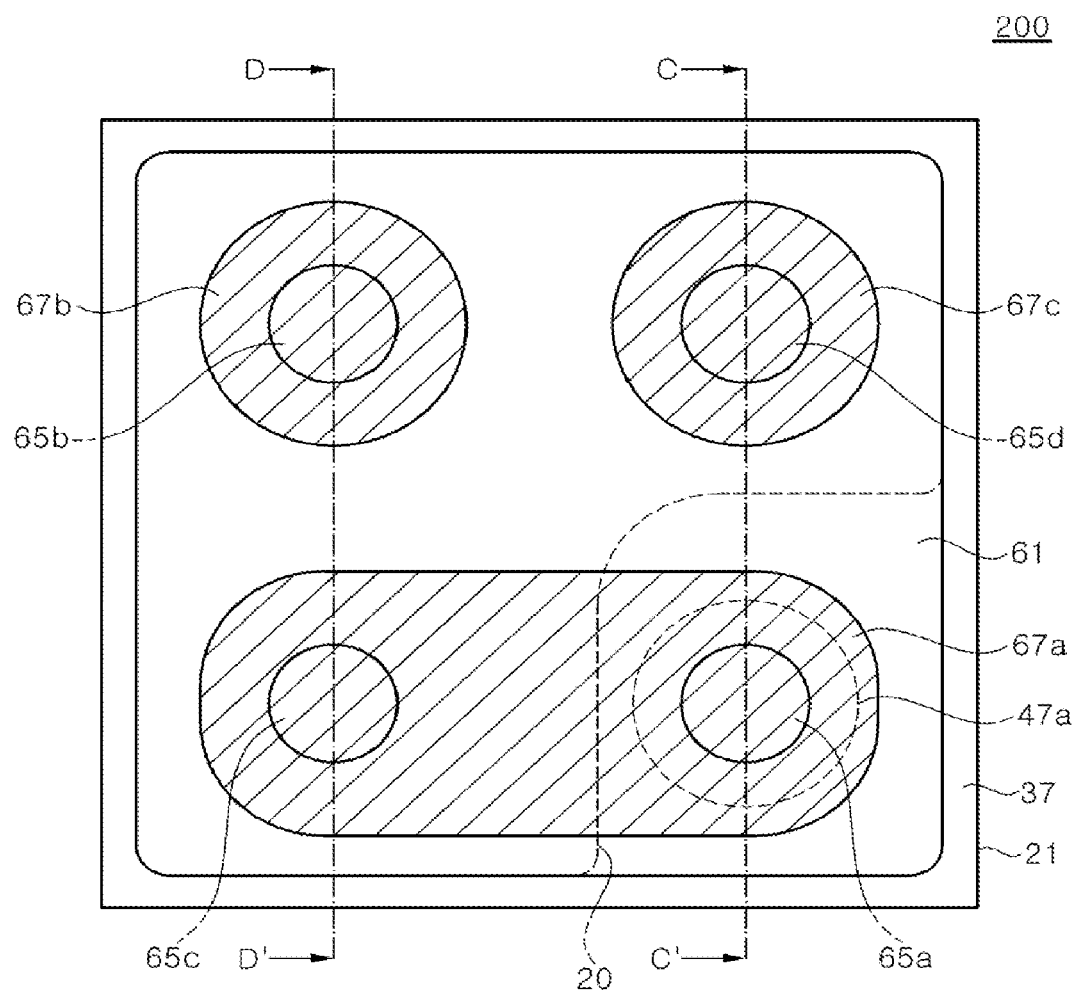
FIG. 10 is a schematic plan view illustrating a light emitting device according to another exemplary embodiment.
Figure 11A:
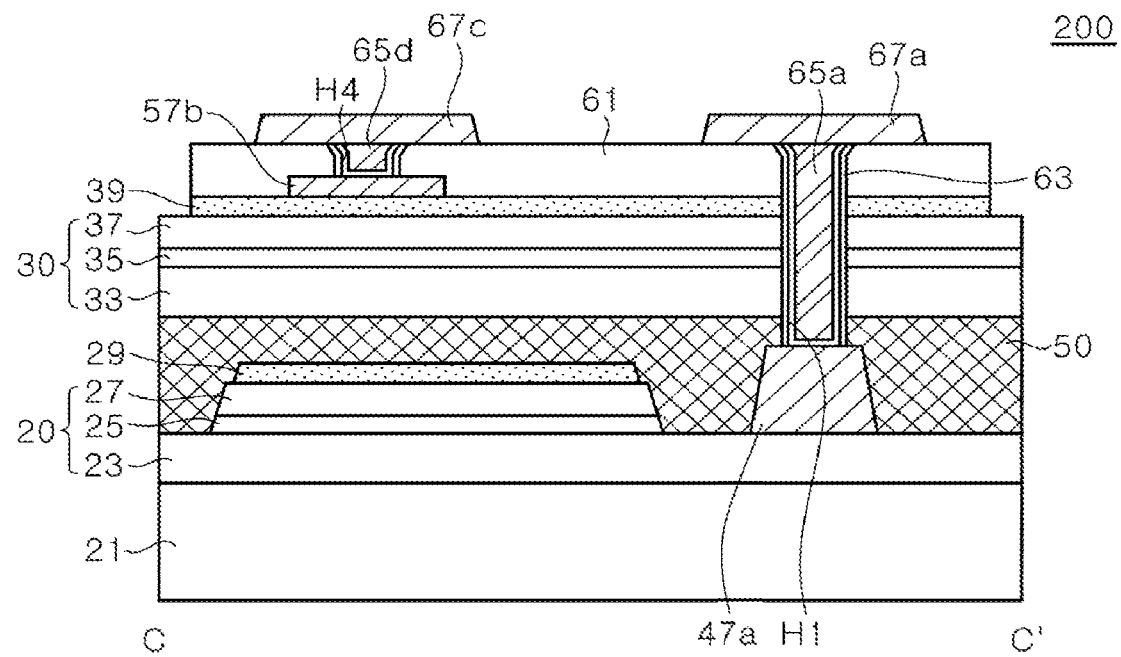
FIG. 11A is a schematic cross-sectional view taken along line C-C' of FIG. 10.
Figure 11B:
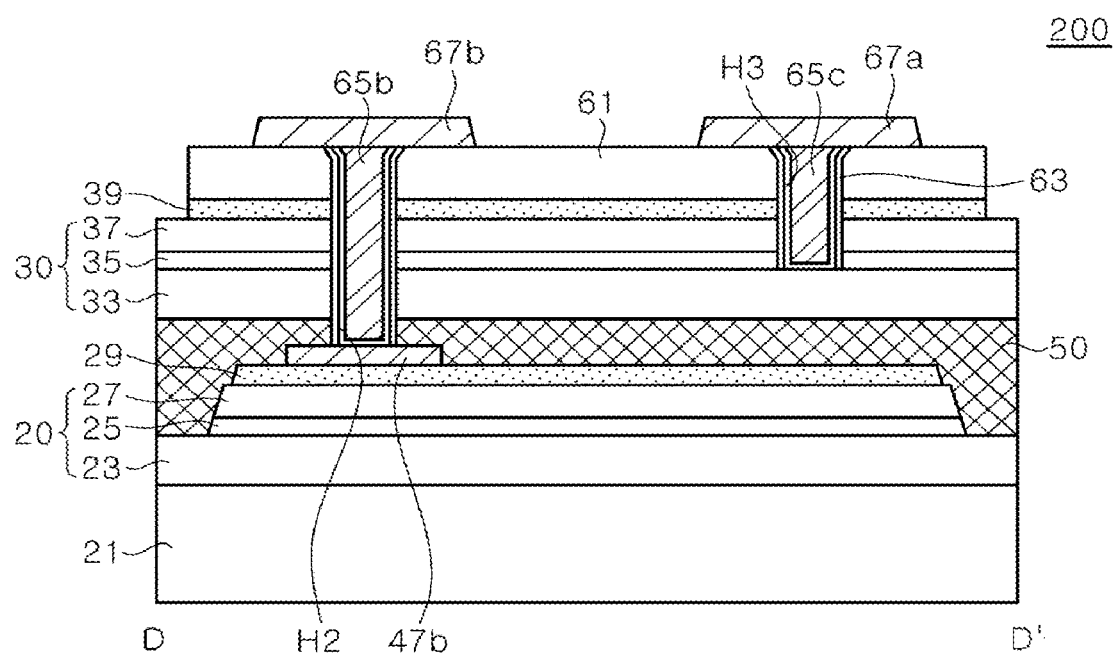
FIG. 11B is a schematic cross-sectional view taken along line D-D' of FIG. 10.

FIG. 10 is a schematic plan view illustrating a light emitting device 200 according to another exemplary embodiment, FIG. 11A is a schematic cross-sectional view taken along line C-C' of FIG. 10, and FIG. 11B is a schematic cross-sectional view taken along line D-D' of FIG. 10.

Referring to FIGS. 10, 11A, and 11B, the light emitting device 200 according to the exemplary embodiment is substantially similar to the light emitting device 100 described with reference to FIGS. 8, 9A, and 9B, but a first LED stack 20 is patterned and the light emitting device 200 further includes a lower n-electrode pad 47a as shown in FIG. 10.

More particularly, a first transparent electrode 29, a second conductivity type semiconductor layer 27, and an active layer 25 shown in FIGS. 11A and 11B are patterned to expose a first conductivity type semiconductor layer 23. The lower n-electrode pad 47a may be formed on the exposed first conductivity type semiconductor layer 23. The lower n-electrode pad 47a may be formed of a material layer in ohmic contact with the first conductivity type semiconductor layer 23, such as Cr/Au/Ti.

Meanwhile, a lower p-electrode pad 47b may be disposed on the first transparent electrode 29. An elevation of an upper surface of the lower p-electrode pad 47b may be substantially similar to that of an upper surface of the lower n-electrode pad 47a.

A through hole H1 may expose the lower n-electrode pad 47a instead of exposing the first conductivity type semiconductor layer 23. Since the elevation of the upper surface of the lower n-electrode pad 47a is substantially similar to that of the upper surface of the lower p-electrode pad 47b, through holes H1 and H2 may be formed together through an identical process.

In the illustrated exemplary embodiment, the patterning of the first LED stack 20 may be performed before the first LED stack 20 and the second LED stack 30 are bonded using an insulation layer 50. Therefore, the insulation layer 50 may cover the exposed first conductivity type semiconductor layer 20, and may cover side surfaces of the first transparent electrode 29, the second conductivity type semiconductor layer 27, and the active layer 25 along with an upper surface of the first transparent electrode 29.

In the illustrated exemplary embodiment, although the first LED stack 20 is exemplarily described as being patterned, the second LED stack 30 may also be patterned to expose a first conductivity type semiconductor layer 33, and an upper n-electrode pad may be formed on the exposed first conductivity type semiconductor layer 33. In addition, an upper p-electrode pad 57*b* is disposed on a second transparent electrode 39. An elevation of an upper surface of the upper p-electrode pad 57*b* and that of an upper surface of the upper n-electrode pad formed on the first conductivity type semiconductor layer 33 may be substantially similar, and thus, through holes H3 and H4 may also be formed together through an identical process.

Figure 12A:
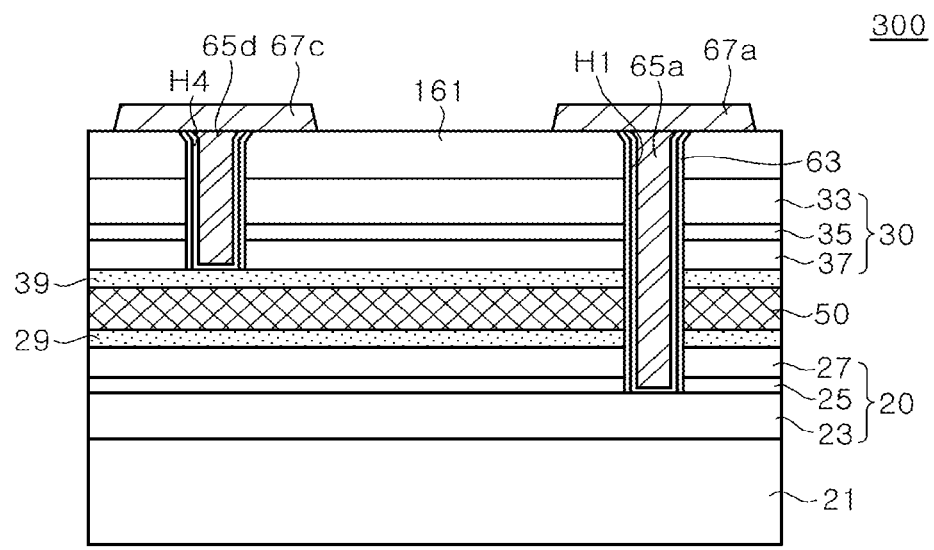
FIG. 12A is schematic cross-sectional view illustrating a light emitting device according to another exemplary embodiment.
Figure 12B:
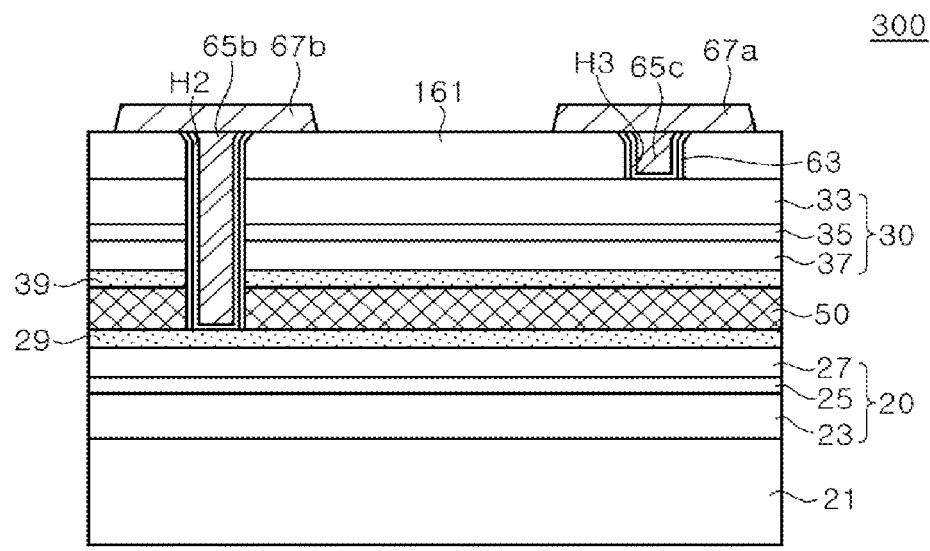
FIG. 12B is schematic cross-sectional view illustrating another light emitting device according to another exemplary embodiment.

FIGS. 12A and 12B are schematic cross-sectional views illustrating a light emitting device 300 according to another exemplary embodiment.

Referring to FIGS. 12A and 12B, the light emitting device 300 according to the exemplary embodiment is substantially similar to the light emitting device 100 described with reference to FIGS. 8, 9A, and 9B, but a second transparent electrode 39 is disposed on a side of an insulation layer 50, and a first conductivity type semiconductor layer 33 is disposed far from the insulation layer 50 in the light emitting device 300. More particularly, a stack sequence of a first LED stack 20, a second LED stack 30, a first transparent electrode 29, and the second transparent electrode 39 disposed on a first substrate 21 is similar to that of those in the light emitting device described with reference to FIG. 3, and detailed descriptions thereof will be omitted.

A planarization layer 161 covers the first conductivity type semiconductor layer 33. The planarization layer 161 may be formed of an aluminum oxide layer, a silicon oxide layer, or a silicon nitride layer. As described with reference to FIGS. 8, 9A, and 9B, the planarization layer 161 may be recessed to expose an edge of the first conductivity type semiconductor layer 33.

In the illustrated exemplary embodiment, a through hole H1 (FIG. 12A) may expose a first conductivity type semiconductor layer 23. In another exemplary embodiment, as described with reference to FIG. 10, the first LED stack 20 may be patterned and formed on the first conductivity type semiconductor layer 23 to which a lower n-electrode pad is exposed, and the through hole H1 may expose the lower n-electrode pad.

A through hole H2 (FIG. 12B) may expose the first transparent electrode 29. In another exemplary embodiment, as described with reference to FIG. 8 or 10, a lower p-electrode pad may be disposed on the first transparent electrode 29, and the through hole H2 may expose the lower p-electrode pad.

A through hole H3 may expose the first conductivity type semiconductor layer 33. An upper n-electrode pad may be added on the first conductivity type semiconductor layer 33, and the through hole H3 may expose the upper n-electrode pad. A through hole H4 may pass through the planarization layer 161 and the second LED stack 30, and expose the second transparent electrode 39.

A sidewall insulation layer 63 may cover inner walls of the through holes H1, H2, H3, and H4, and expose bottom surfaces thereof. In addition, as described above, buried vias 65*a*, 65*b*, 65*c*, and 65*d* may be formed in the through holes H1, H2, H3, and H4, respectively, and bonding pads 67*a*, 67*b*, and 67*c* may be disposed on the planarization layer 161 to cover the buried vias 65*a*, 65*b*, 65*c*, and 65*d*.

According to the illustrated exemplary embodiment, the first bonding pad 67*a* electrically connects the buried vias 65*a* and 65*c*, and thus, the first conductivity type semiconductor layers 23 and 33 of the first LED stack 20 and the second LED stack 30 are commonly electrically connected. Meanwhile, the second bonding pad 67*b* may be electrically connected to a second conductivity type semiconductor layer 27 through the buried via 65*b* and the first transparent electrode 29, and the third bonding pad 67*c* may be electrically connected to a second conductivity type semiconductor layer 37 through the buried via 65*d* and the second transparent electrode 39. In another exemplary embodiment, the second conductivity type semiconductor layers 27 and 37 of the first LED stack 20 and the second LED stack 30 may be commonly electrically connected, and the first conductivity type semiconductor layers 23 and 33 may be electrically spaced apart. In another exemplary embodiment, the first conductivity type semiconductor layers 23 and 33 of the first LED stack 20 and the second LED stack 30 are commonly electrically connected, and the second conductivity type semiconductor layers 27 and 37 are also commonly electrically connected.

Figure 13A:
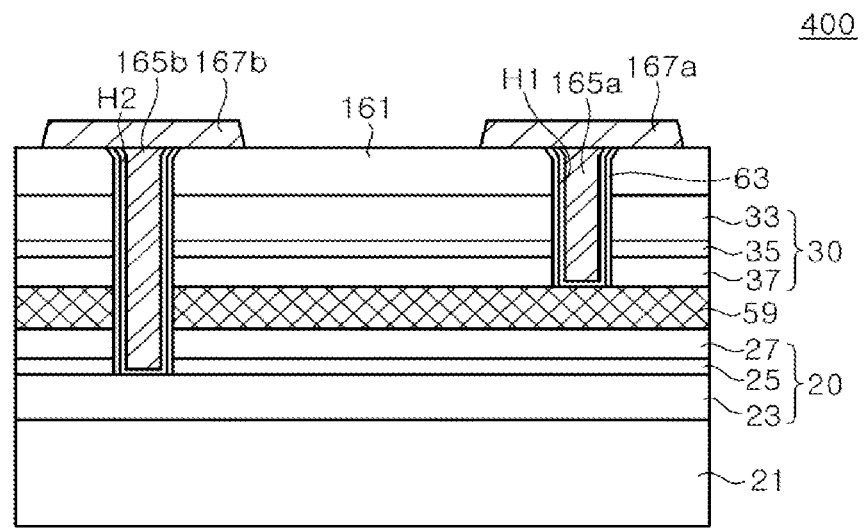
FIG. 13A is a schematic cross-sectional view illustrating a light emitting device according to another exemplary embodiment.
Figure 13B:
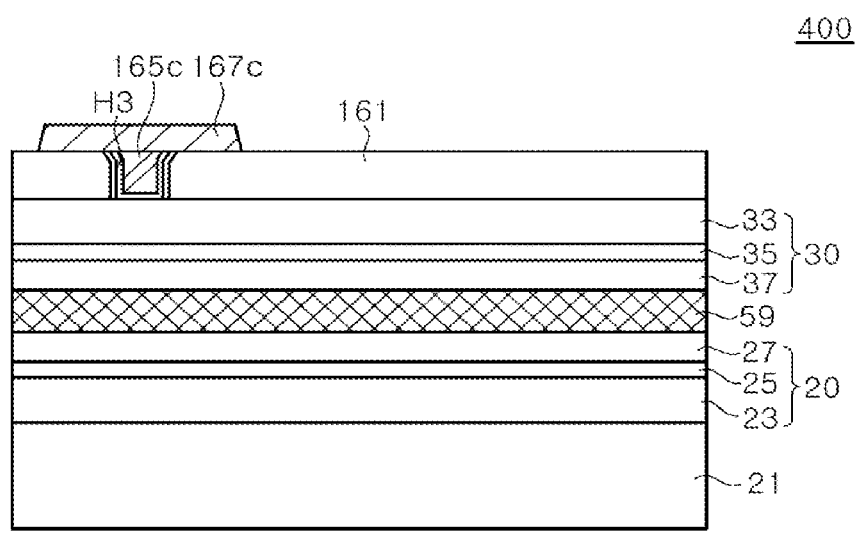
FIG. 13B is a schematic cross-sectional view illustrating yet another light emitting device according to another exemplary embodiment.

FIGS. 13A and 13B are schematic cross-sectional views illustrating a light emitting device 400 according to another exemplary embodiment.

Referring to FIGS. 13A and 13B, the light emitting device 400 according to the exemplary embodiment includes a transparent electrode 59 that combines a first LED stack 20 and a second LED stack 30 to each other. More particularly, the first LED stack 20 and the second LED stack 30 are bonded by the transparent electrode 59. The transparent electrode 59 is commonly electrically connected to a second conductivity type semiconductor layer 27 of the first LED stack 20 and a second conductivity type semiconductor layer 37 of the second LED stack 30.

A through hole H1 exposes the transparent electrode 59, a through hole H2 exposes a first conductivity type semiconductor layer 23, and a through hole H3 exposes a first conductivity type semiconductor layer 33. In the illustrated exemplary embodiment, the light emitting device 400 may have three through holes H1, H2, and H3, and a fourth through hole H4 may be omitted.

As described above, a sidewall insulation layer 63 is formed, buried vias 165*a*, 165*b*, and 165*c* may be formed in the through holes H1, H2, and H3, and bonding pads 167*a*, 167*b*, and 167*c* may be formed on a planarization layer 161.

In the illustrated exemplary embodiment, the first bonding pad 167*a* may be commonly electrically connected to the second conductivity type semiconductor layers 27 and 37 through the transparent electrode 59, and the second and third bonding pads 167*b* and 167*c* may be electrically connected to the first conductivity type semiconductor layer 23 and the first conductivity type semiconductor layer 33, respectively.

Figure 14:
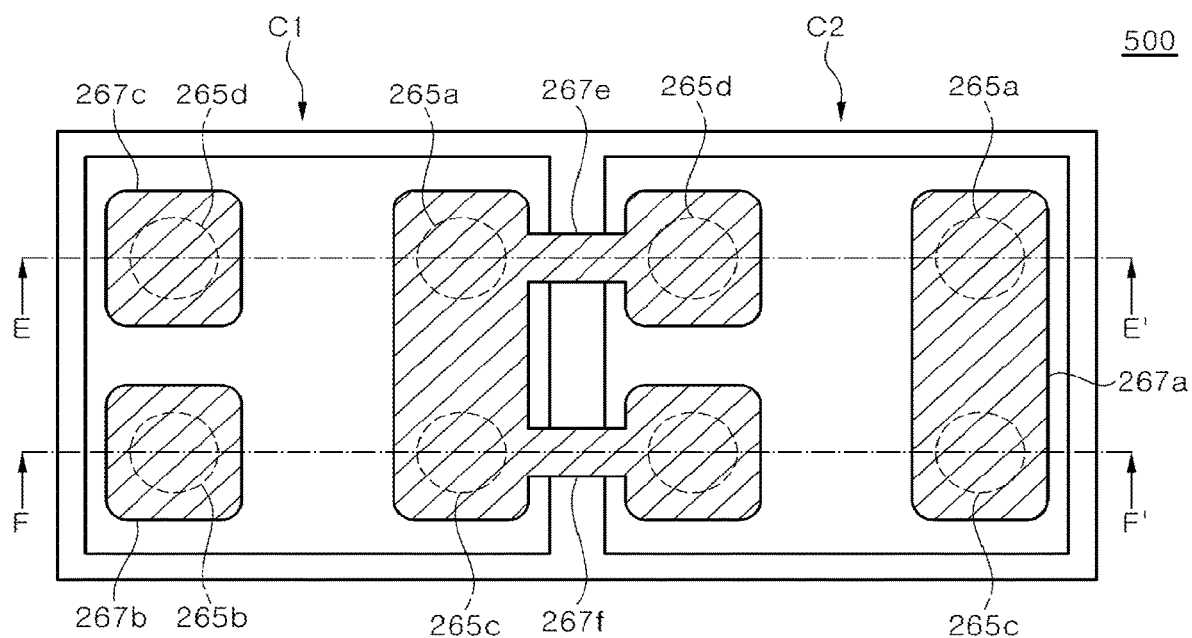
FIG. 14 is a schematic plan view illustrating a light emitting device according to another exemplary embodiment.
Figure 15A:
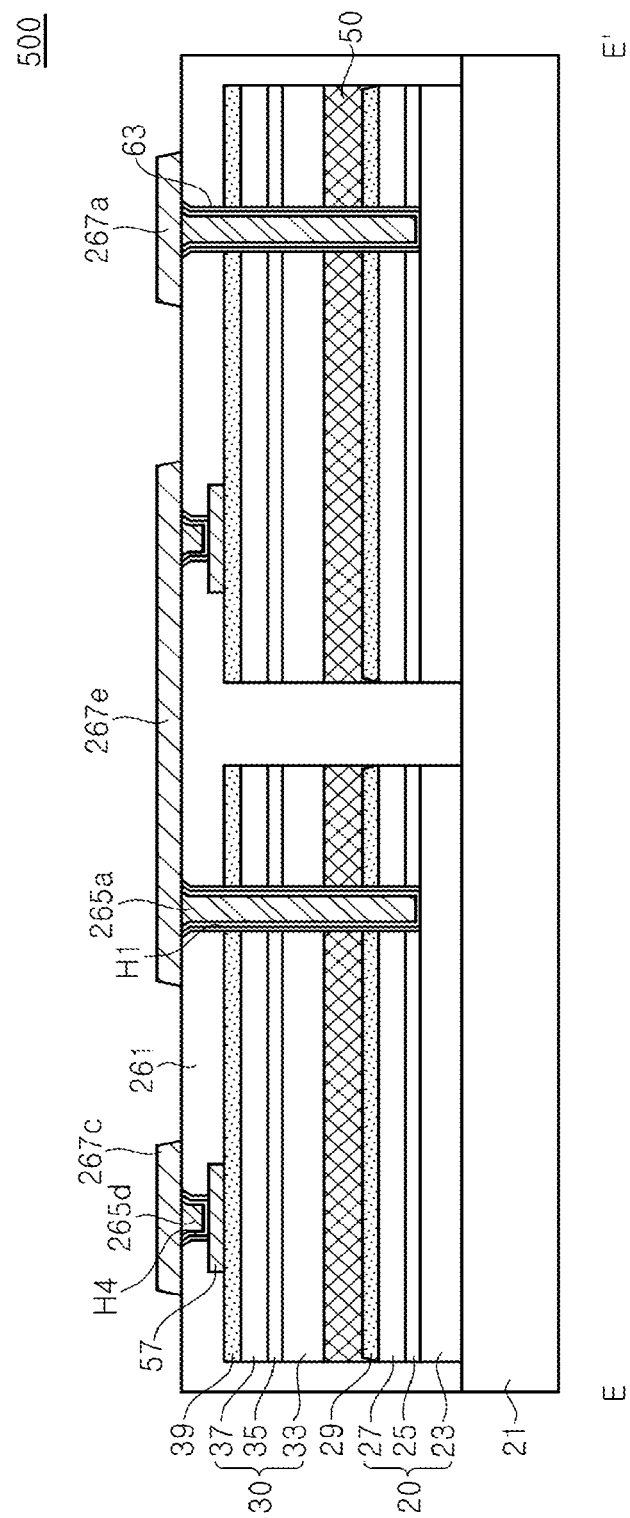
FIG. 15A is a schematic cross-sectional view taken along line E-E' of FIG. 14.
Figure 15B:
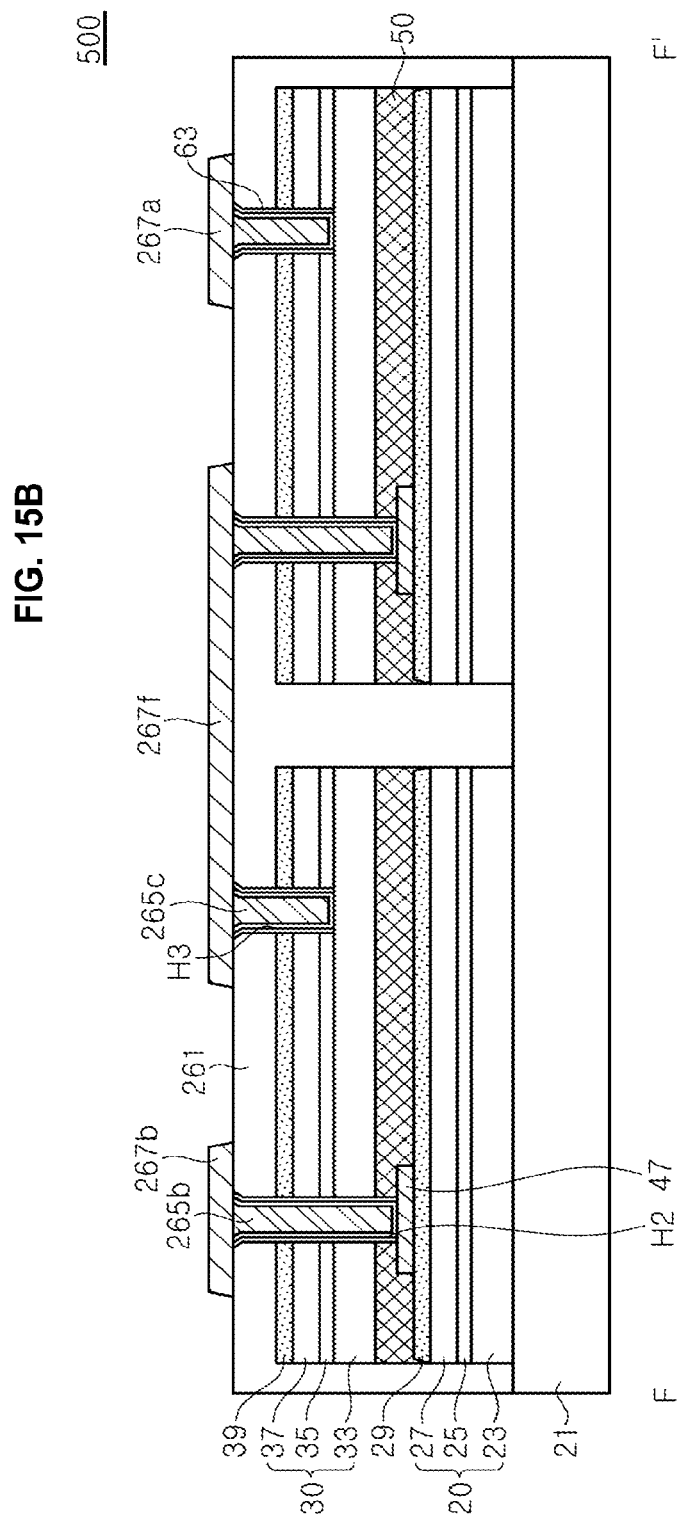
FIG. 15B is a schematic cross-sectional view taken along line F-F' of FIG. 14.
Figure 16:
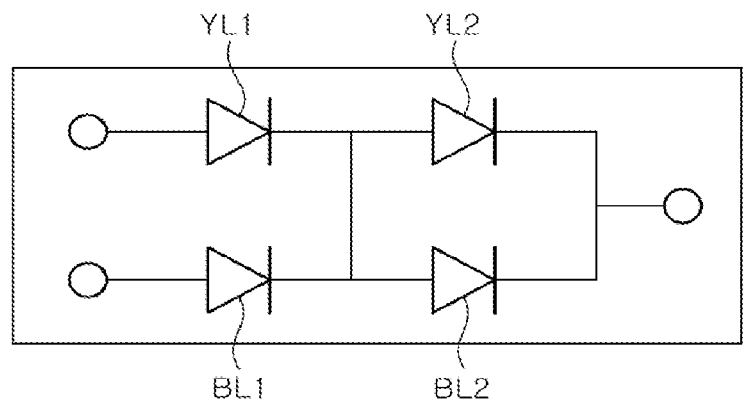
FIG. 16 is a schematic circuit diagram of the light emitting device of FIG. 14.

FIG. 14 is a schematic plan view illustrating a light emitting device 500 according to another exemplary embodiment, FIG. 15A is a schematic cross-sectional view taken along line E-E' of FIG. 14, FIG. 15B is a schematic cross-sectional view taken along line F-F' of FIG. 14, and FIG. 16 is a schematic circuit diagram of the light emitting device 500 of FIG. 14.

Referring to FIGS. 14, 15A, and 15B, the light emitting device 500 according to the exemplary embodiment is substantially similar to the light emitting device 100 described with reference to FIGS. 8, 9A, and 9B, but the light emitting device 500 includes a plurality of light emitting cells C1 and C2. Since a layer structure of each of the light emitting cells C1 and C2 is substantially similar to that of the light emitting device 100, detailed descriptions thereof will be omitted.

The light emitting cells C1 and C2 are spaced apart from one another on a substrate 21. After a first LED stack 20 and a second LED stack 30 are bonded using an insulation layer 50, the light emitting cells C1 and C2 spaced apart from one another may be formed by sequentially etching a second transparent electrode 39, the second LED stack 30, and the insulation layer 50.

As shown in FIG. 15A, a planarization layer 261 may cover the substrate 21 in an isolation region between the light emitting cells C1 and C2 together with the light emitting cells C1 and C2. An upper surface of the planarization layer 261 may be flat.

Through holes H1, H2, H3, and H4 and sidewall insulation layers 63 are formed in each of the light emitting cells C1 and C2 as described with reference to FIGS. 8, 9A, and 9B, and buried vias 265a, 265b, 265c, and 265d are formed in the through holes H1, H2, H3, and H4.

In addition, as described with reference to FIGS. 8, 9A, and 9B, the buried vias 265a and 265b electrically connected to a first conductivity type semiconductor layer 23 and a second conductivity type semiconductor layer 27 of the first LED stack 20 are disposed in the diagonal direction in each of the light emitting cells C1 and C2. In addition, the buried vias 265c and 265d electrically connected to a first conductivity type semiconductor layer 33 and a second conductivity type semiconductor layer 37 of the second LED stack 30 are disposed in the diagonal direction in each of the light emitting cells C1 and C2. Since the buried vias 265a and 265b connected to the first LED stack 20 and the buried vias 265c and 265d electrically connected to the second LED stack 30 are disposed in the diagonal direction, current spread in the first LED stack 20 and the second LED stack 30 may be assisted, and thus, luminous efficiency may be increased.

Subsequently, connectors 267e and 267f may be formed together with bonding pads 267a, 267b, and 267c. The bonding pads 267a may be disposed on the second light emitting cell C2, and may be electrically connected to the first conductivity type semiconductor layers 23 and 33 through the buried vias 265a and 265c in the second light emitting cell C2.

The bonding pad 267b and the bonding pad 267c may be disposed on the first light emitting cell C1, and may be electrically connected to the buried vias 265b and 265d, respectively.

Meanwhile, the connectors 267e and 267f electrically connect the first light emitting cell C1 and the second light emitting cell C2. Specifically, the connector 267e electrically connects the buried vias 265a and 265c of the first light emitting cell C1 and the buried via 265d of the second light emitting cell C2 to one another, and the connector 267f electrically connects the buried vias 265a and 265c and the buried via 265c of the second light emitting cell C2 to one another.

As such, as illustrated in FIG. 16, the light emitting device 500 in which a short wavelength light emitting portion BL1 and a long wavelength light emitting portion YL1 of the first light emitting cell C1, and a short wavelength light emitting portion BL2 and a long wavelength light emitting portion YL2 of the second light emitting cell C2 are connected in series-parallel. In particular, the short wavelength light emitting portion BL1 of the first light emitting cell C1 and the first conductivity type semiconductor layers 23 and 33 of the long wavelength light emitting portion YL1 are electrically connected to one another, and further, the short wavelength light emitting portion BL2 of the second light emitting cell C2 and the second conductivity type semiconductor layers 27 and 37 of the long wavelength light emitting portion YL2 are also electrically connected.

In the illustrated exemplary embodiment, although the through holes H1, H2, H3, and H4 are exemplarily illustrated and described as being formed in each of the light emitting cells C1 and C2, the inventive concepts are not limited thereto. Instead of forming the through holes, the first and second conductivity type semiconductor layers 23, 33, 27, and 37 or the first and second transparent electrodes 29 and 39 may be exposed using various techniques such as mesa etching, and an electrical connection may be formed thereto.

A method of connecting the plurality of light emitting cells C1 and C2 may be various. Hereinafter, light emitting devices connecting the light emitting cells C1 and C2 will be described using a circuit diagram.

Figure 17:
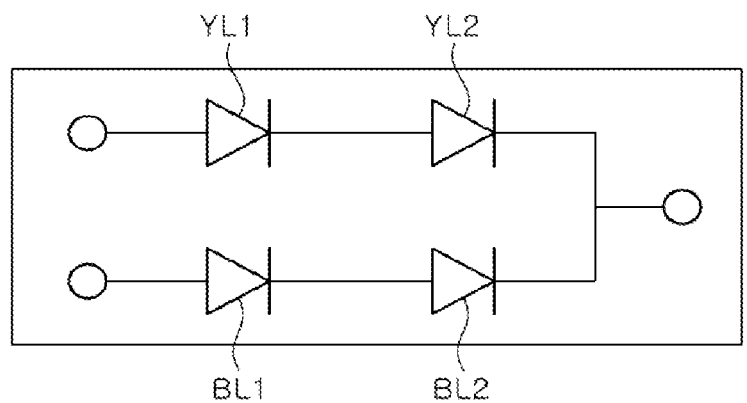
FIG. 17 is a schematic circuit diagram illustrating a light emitting device according to some exemplary embodiments.
Figure 18:
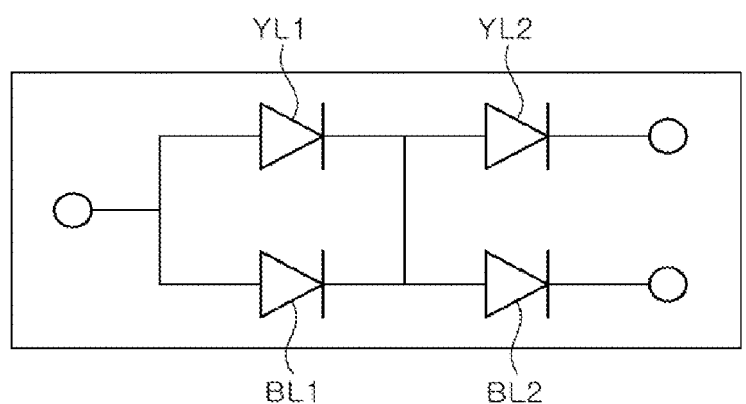
FIG. 18 is another schematic circuit diagram illustrating the light emitting device according to some exemplary embodiments.
Figure 19:
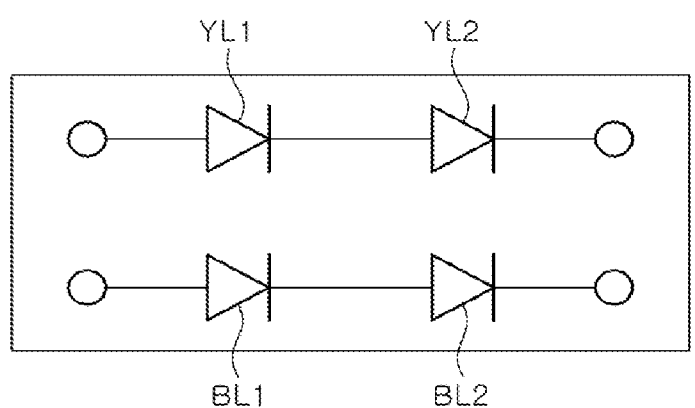
FIG. 19 is further another schematic circuit diagram illustrating the light emitting device according to some exemplary embodiments.

FIGS. 17 through 19 are schematic circuit diagrams illustrating light emitting devices 600, 700, and 800 according to some exemplary embodiments.

First, referring to FIG. 17, the light emitting device 600 according to the exemplary embodiment is substantially similar to the light emitting device 500 described with reference to FIG. 16, but a short wavelength light emitting portion BL1 of a first light emitting cell C1 and first conductivity type semiconductor layers 23 and 33 of a long wavelength light emitting portion YL1 are electrically separated from one another. Further, a short wavelength light emitting portion BL2 of a second light emitting cell C2 and second conductivity type semiconductor layers 27 and 37 of the long wavelength light emitting portion YL2 are also electrically spaced apart. For example, the connectors 267e and 267f in the exemplary embodiment of FIG. 14 may be separated from each other to provide the light emitting device 600 of the circuit diagram of FIG. 17.

Referring to FIG. 18, the light emitting device 700 according to the exemplary embodiment is substantially similar to the light emitting device 500 described with reference to FIG. 16, but in the light emitting device 700, a short wavelength light emitting portion BL1 of a first light emitting cell C1 and second conductivity type semiconductor layers 27 and 37 of a long wavelength light emitting portion YL1 are commonly electrically connected, and a short wavelength light emitting portion BL2 of a second light emitting cell C2 and second conductivity type semiconductor layers 27 and 37 of a long wavelength light emitting portion YL2 are electrically spaced apart from one another. The short wavelength light emitting portion BL1 of the first light emitting cell C1 and first conductivity type semiconductor layers 23 and 33 of the long wavelength light emitting portion YL1 are commonly electrically connected, and the short wavelength light emitting portion BL2 of the second light emitting cell C2 and the first conductivity type semiconductor layers 23 and 33 of the long wavelength light emitting portion YL2 are electrically connected to one another.

Referring to FIG. 19, in the light emitting device 800 according to the illustrated exemplary embodiment, a short wavelength light emitting portion BL1 of a first light emitting cell C1 is connected in series with a short wavelength light emitting portion BL2 of a second light emitting cell C2, and a long wavelength light emitting portion YL1 of a first light emitting cell C1 is connected in series with a long wavelength light emitting portion YL2 of the second light emitting cell C2. Meanwhile, the short wavelength light emitting portions BL1 and BL2 and the long wavelength light emitting portions YL1 and YL2 are electrically spaced apart from one another.

From above, although it has been described in some exemplary embodiments that the short wavelength light emitting portion BL1 and the long wavelength light emitting portion YL1 of the first light emitting cell C1, and the short wavelength light emitting portion BL2 and the long wavelength light emitting portion YL2 of the second light emitting cell C2 are connected, the inventive concepts are not limited to the specific exemplary embodiments described above.

Although some embodiments have been described herein, it should be understood that these embodiments are provided for illustration only and are not to be construed in any way as limiting the present disclosure. It should be understood that features or components of one or more embodiments can also be applied to other embodiments without departing from the spirit and scope of the present disclosure.

What is claimed is:

1. A light emitting device, comprising:
a first short wavelength emission region;
a second short wavelength emission region;
a first long wavelength emission region;
a second long wavelength emission region;
a first electrode disposed on each of the first and second short wavelength emission regions;
a second electrode disposed on each of the first and second long wavelength emission regions;
a transparent layer disposed between the second short wavelength emission region and the second long wavelength emission region, wherein:
the first and second short wavelength emission regions each include an active layer and a second conductivity type semiconductor layer,
the first and second long wavelength emission regions each include a first conductivity type semiconductor layer and an active layer,
the transparent layer is disposed between the active layer of the first short wavelength emission region and the active layer of the first long wavelength emission region,
the active layer of the first and second long wavelength emission regions contain more Indium (In) than the active layer of the first and second short wavelength emission regions,
the active layer of the first and second short wavelength emission regions emit light of a shorter wavelength than that of light emitted from the first and second long wavelength emission regions,
the transparent layer includes a material without phosphor,
the first long wavelength emission region and the second long wavelength emission region are electrically connected in series with each other, and the first short wavelength emission region and the second short wavelength emission region are electrically connected in series with each other, and
the first long wavelength emission region and the second long wavelength emission region are electrically spaced apart from the first short wavelength emission region and the second short wavelength emission region.

2. The light emitting device of claim 1, further comprising: a substrate disposed on a side of the first and second short wavelength emission regions or the first and second long wavelength emission regions.

3. The light emitting device of claim 1, wherein the first and second short wavelength emission regions emit blue light, and the first and second long wavelength emission regions emit green light.

4. The light emitting device of claim 1, wherein the first and second long wavelength emission regions and the first and second short wavelength emission regions are driven independently from each other.

5. The light emitting device of claim 1, further comprising:
a first pad electrically connected to each of the first and second short wavelength emission regions; and
a second pad and a third pad electrically connected to each of the first and second short wavelength emission regions and each of the first and second long wavelength emission regions, respectively.

6. The light emitting device of claim 5, wherein:
the second pad is electrically connected to the second conductivity type semiconductor layer of each of the first and second short wavelength emission regions, and
the third pad is electrically connected to the second conductivity type semiconductor layer of each of the first and second long wavelength emission regions.

7. The light emitting device of claim 6, further comprising: a connector contacting the first pad, wherein the connector is extended from the first pad to outward of each of the first and second short wavelength emission regions.

8. The light emitting device of claim 7, wherein the connector is covered by the transparent layer, and wherein the second electrode is disposed between the active layer of the second long wavelength emission region and the transparent layer.

9. The light emitting device of claim 7, further comprising a planarization layer disposed on each of the first and second short wavelength emission regions, wherein the planarization layer is disposed between the second conductivity type semiconductor layer of each of the first and second short wavelength emission regions and the connector.

10. The light emitting device of claim 1, wherein: the light emitted from the first and second long wavelength emission regions and the light emitted from the first and second short wavelength emission regions are combined to implement light having a color different from colors of the light emitted from the first and second short and first and second long wavelength emission regions.

11. A light emitting module, comprising:
a circuit board having pads; and
a light emitting device bonded to the pads on the circuit board, the light emitting device comprising:
a first short wavelength emission region;
a second short wavelength emission region;
a first long wavelength emission region;
a second long wavelength emission region;
a first electrode disposed on each of the first and second short wavelength emission regions;
a second electrode disposed on each of the first and second long wavelength emission regions; and
a transparent layer disposed between the second short wavelength emission region and the second long wavelength emission region, wherein:
the first and second short wavelength emission regions each include an active layer and a second conductivity type semiconductor layer,
the first and second long wavelength emission regions each include a first conductivity type semiconductor layer and an active layer,
the transparent layer is disposed between the active layer of each of the first and second short wavelength emission regions and the active layer of each of the first and second long wavelength emission regions, the active layer of the first and second long wavelength emission regions contain more Indium (In) than the active layer of the first and second short wavelength emission regions, the active layer of the first and second short wavelength emission regions each emit light of a shorter wavelength than that of light emitted from the first and second long wavelength emission regions, and the transparent layer includes a material without phosphor, the first long wavelength emission region and the second long wavelength emission region are electrically connected in series with each other, and the first short wavelength emission region and the second short wavelength emission region are electrically connected in series with each other, and the first long wavelength emission region and the second long wavelength emission region are electrically spaced apart from the first short wavelength emission region and the second short wavelength emission region.

12. The light emitting device of claim 11, further comprising: a substrate disposed on a side of the first and second short wavelength emission regions or the first and second long wavelength emission regions.

13. The light emitting device of claim 11, wherein the first and second short wavelength emission regions emit blue light, and the first and second long wavelength emission regions emit green light.

14. The light emitting device of claim 11, wherein the first and second long wavelength emission regions and the first and second short wavelength emission regions are driven independently from each other.

15. The light emitting device of claim 11, further comprising:

a first pad electrically connected to each of the first and second short wavelength emission regions; and a second pad and a third pad electrically connected to each of the first and second short wavelength emission regions and each of the first and second long wavelength emission regions, respectively.

16. The light emitting device of claim 15, wherein:

the second pad is electrically connected to the second conductivity type semiconductor layer of each of the first and second short wavelength emission regions, and the third pad is electrically connected to the second conductivity type semiconductor layer of each of the first and second long wavelength emission regions.

17. The light emitting device of claim 16, further comprising: a connector contacting the first pad, wherein the connector is extended from the first pad to outward of each of the first and second short wavelength emission regions.

18. The light emitting device of claim 17, wherein the connector is covered by the transparent layer, and wherein the second electrode is disposed between the active layer of the second long wavelength emission region and the transparent layer.

19. The light emitting device of claim 17, further comprising: a planarization layer disposed on each of the first and second short wavelength emission regions, wherein the planarization layer is disposed between the second conductivity type semiconductor layer of each of the first and second short wavelength emission regions and the connector.

20. The light emitting device of claim 11, wherein: the light emitted from the first and second long wavelength emission regions and the light emitted from the first and second short wavelength emission regions are combined to implement light having a color different from colors of the light emitted from the first and second short and first and second long wavelength emission regions.

* * * * *